(12) United States Patent
Wright et al.

(10) Patent No.: US 10,413,767 B2
(45) Date of Patent: Sep. 17, 2019

(54) SQUIB CIRCUIT FOR FIRE PROTECTION SYSTEM

(71) Applicant: The Boeing Company, Chicago, IL (US)

(72) Inventors: Robert Steven Wright, Seattle, WA (US); Eric B. Gilbert, Seattle, WA (US); Timothy LeRoy Skilton, Bellevue, WA (US)

(73) Assignee: The Boeing Company, Chicago, IL (US)

( * ) Notice: Subject to any disclaimer, the term of this patent is extended or adjusted under 35 U.S.C. 154(b) by 110 days.

(21) Appl. No.: 15/711,076

(22) Filed: Sep. 21, 2017

(65) Prior Publication Data

US 2019/0083834 A1  Mar. 21, 2019

(51) Int. Cl.
| | | |
|---|---|---|
| *A62C 37/50* | (2006.01) | |
| *A62C 3/08* | (2006.01) | |
| *A62C 35/08* | (2006.01) | |
| *G01R 31/28* | (2006.01) | |
| *G01R 27/02* | (2006.01) | |
| *A62C 35/13* | (2006.01) | |
| *A62C 35/02* | (2006.01) | |

(52) U.S. Cl.
CPC ............... *A62C 37/50* (2013.01); *A62C 3/08* (2013.01); *A62C 35/08* (2013.01); *G01R 27/02* (2013.01); *G01R 31/2832* (2013.01); *A62C 35/023* (2013.01); *A62C 35/13* (2013.01)

(58) Field of Classification Search
CPC ......... A62C 37/50; A62C 35/08; A62C 35/13; A62C 35/023; G01R 31/2832; G01R 27/02
See application file for complete search history.

(56) References Cited

U.S. PATENT DOCUMENTS

| | | | | |
|---|---|---|---|---|
| 5,382,912 A | * | 1/1995 | Blain ..................... | G01R 27/14 280/735 |
| 5,621,326 A | * | 4/1997 | Watanabe ........... | B60R 21/0173 280/735 |
| 6,300,764 B1 | * | 10/2001 | Kelley ............... | G01R 31/2829 102/217 |
| 2004/0196615 A1 | * | 10/2004 | Bennett ............... | B60R 21/0173 361/247 |
| 2015/0015281 A1 | * | 1/2015 | Bogner .................. | G01R 27/20 324/705 |

* cited by examiner

*Primary Examiner* — Jeff W Natalini
(74) *Attorney, Agent, or Firm* — Yee & Associates, P.C.

(57) ABSTRACT

A system, apparatus, and method for testing a squib circuit. An electrical signature of the squib circuit is monitored when a test switch in the squib circuit is activated. The electrical signature of the squib circuit is based on characterizing resistors electrically connected to squibs in the squib circuit in which each characterizing resistor in the characterizing resistors has a resistance value. A health of each squib in the squib circuit is determined based on the electrical signature of the squib circuit.

30 Claims, 6 Drawing Sheets

| 400 | | |
|---|---|---|
| Total System Resistance | Condition | System Current |
| 17.71 | Normal | 1.581 |
| 18.21 | S1 failed | 1.537 |
| 18.29 | S2 failed | 1.531 |
| 18.49 | S3 failed | 1.514 |
| 18.70 | S4 failed | 1.497 |
| 18.79 | S1+S2 failed | 1.490 |
| 18.99 | S1+S3 failed | 1.475 |
| 19.20 | S1+S4 failed | 1.458 |
| 19.07 | S2+S3 failed | 1.469 |
| 19.27 | S2+S4 failed | 1.453 |
| 19.47 | S3+S4 failed | 1.438 |
| 19.57 | S1+S2+S3 failed | 1.431 |
| 19.77 | S1+S2+S4 failed | 1.416 |
| 19.97 | S1+S3+S4 failed | 1.402 |
| 20.05 | S2+S3+S4 failed | 1.397 |
| 20.55 | All failed | 1.363 |

FIG. 4

| 500 | | |
|---|---|---|
| Total System Resistance | Condition | System Current |
| 27.27 | Normal | 1.027 |
| 28.20 | T1 failed | 0.993 |
| 27.70 | T2 failed | 1.011 |
| 27.55 | T3 failed | 1.016 |
| 27.48 | T4 failed | 1.019 |
| 29.94 | T1+T2 failed | 0.935 |
| 29.21 | T1+T3 failed | 0.958 |
| 28.92 | T1+T4 failed | 0.968 |
| 28.25 | T2+T3 failed | 0.991 |
| 28.10 | T2+T4 failed | 0.996 |
| 27.87 | T3+T4 failed | 1.004 |
| 35.00 | T1+T2+T3 failed | 0.800 |
| 33.00 | T1+T2+T4 failed | 0.848 |
| 31.00 | T1+T3+T4 failed | 0.903 |
| 29.00 | T2+T3+T4 failed | 0.966 |
| ∞ | All failed | 0.000 |

SQUIB CIRCUIT FOR FIRE PROTECTION SYSTEM

BACKGROUND INFORMATION

1. Field

The present disclosure relates generally to fire protection systems and, in particular, to squib circuits for fire protection systems in aircraft.

2. Background

Fire protection systems are used in aircraft to increase the safety of the aircraft. Fire protection systems may be assigned to different zones. For example, the zones may include an engine, an auxiliary power unit, a cargo and baggage compartment, a lavatory, electronics bay, a bleed air duct, a wheel well, or some other suitable area in an aircraft.

The fire protection system includes a sensor system with detectors to detect an undesired condition in the different zones and an extinguisher system to extinguish a fire. Extinguisher systems may include a number of different types of extinguishers. These extinguishers include containers such as fire extinguishing bottles that may take the form of high rate discharge (HRD) bottles.

The fire extinguishing bottles typically contain Halon 1301 or an equivalent fire extinguishing agent pressurized with nitrogen. Tubing connects the fire extinguishing bottles to discharge nozzles in zones that are assigned to the fire extinguishing bottles. These fire extinguishing bottles are associated with squibs. A squib is an electrically operated explosive device. The squib can be connected to a bottle diaphragm. The bottle diaphragm normally seals the fire extinguishing bottle. When a switch is activated for a zone covered by a fire extinguisher bottle, the squib fires and breaks the diaphragm. Nitrogen pressure inside of the fire extinguishing bottle pushes the Halon 1301 through the discharge port into the zone. An equivalent fire extinguishing agent instead of Halon 1301 may be used that is pressurized with nitrogen or some other suitable gas.

In some cases, multiple fire extinguishing bottles are discharged simultaneously in response to a single initiation event. With this type of arrangement, one or more squib circuits with multiple squibs may be connected to the fire extinguishing bottles.

Currently, in designing circuits for fire protection systems, the designer may run a large number of electrical poles through a switch and route large amounts of wiring to the array of squibs and fire extinguishing bottles. For example, if the discharge and monitoring system for the squib circuit in a commercial passenger aircraft is located in the flight deck and the squibs are located at the engine, the length and weight for the wires may be greater than desired.

Alternatively, a single line of wire may be connected to all of the squibs to reduce overall length and weight of the wires. However, a failure in one of the squibs can render the entire squib circuit useless.

A separate circuit may be connected through the same test switch and discharge switch for each fire extinguishing bottle. This type of architecture increases the availability of the squibs. However, this type of architecture has an expense, complexity, and weight that is often greater than desired.

Therefore, it would be desirable to have a method and apparatus that take into account at least some of the issues discussed above, as well as other possible issues. For example, it would be desirable to have a method and apparatus that overcome a technical problem with reducing the weight of a squib circuit while maintaining a desired level of operation for the squib circuit, along with reducing at least one of expense or complexity of the squib circuit.

SUMMARY

An embodiment of the present disclosure provides an apparatus comprising a test switch in a circuit path and characterizing resistors. The test switch is electrically connected to squibs in a squib circuit and to a power source. The characterizing resistors are electrically connected to the test switch in the squib circuit. The characterizing resistors are electrically connected to the squibs in which each characterizing resistor in the characterizing resistors has a resistance value. An electrical signature of the squib circuit based on the characterizing resistors indicates a health of the squib circuit.

Another embodiment of the present disclosure provides a fire protection system. The fire protection system is comprised of a group of extinguishing bottles and a squib circuit. The squib circuit comprises squibs connected the group of fire extinguishing bottles, a discharge switch, a test switch, characterizing resistors, and a monitoring circuit. The discharge switch is configured to cause the squibs in a circuit path to detonate when the discharge switch is activated. The test switch is electrically connected to the squibs in the circuit path. The characterizing resistors are electrically connected to the test switch in the squib circuit. The characterizing resistors are electrically connected to squibs in which each characterizing resistor in the characterizing resistors has a resistance value. An electrical signature of the squib circuit based on the characterizing resistors indicates a health of each squib in the squib circuit. The monitoring circuit is electrically connected to the squib circuit, wherein the monitoring circuit is configured to monitor the electrical signature of the squib circuit when the test switch is activated.

Yet another embodiment of the present disclosure provides a method for testing a squib circuit. An electrical signature of the squib circuit is monitored when a test switch in the squib circuit is activated. The electrical signature of the squib circuit is based on characterizing resistors electrically connected to squibs in the squib circuit in which each characterizing resistor in the characterizing resistors has a resistance value. A health of the squib circuit is determined based on the electrical signature of the squib circuit.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

DETAILED DESCRIPTION

The illustrative embodiments recognize and take into account one or more different considerations. For example, the illustrative embodiments recognize and take into account that a single squib circuit with multiple squibs connected to multiple fire extinguishing bottles may be designed in a manner that reduces the amount of wiring as compared to having a separate circuit for each squib. The illustrative embodiments recognize and take into account that the use of characterizing resistors associated with squibs results in a specific electrical signature for the squib circuit. The illustrative embodiments recognize and take into account that the electrical signature changes in response to changes in the condition of particular fire extinguishing bottles. The illustrative embodiments recognize and take into account that particular fire extinguishing bottles may be identified as capable of operating or failed based on the electrical signature.

Thus, the illustrative embodiments provide a method, apparatus, and system for testing a squib circuit. In one illustrative example, the process is present for testing a squib circuit using a test switch. The test switch uses the same circuit as the discharge switch. The process monitors an electrical signature of the squib circuit when a test switch in the squib circuit is in a test state. The electrical signature of the squib circuit is based on characterizing resistors electrically connected to squibs in the squib circuit in which each characterizing resistor in the characterizing resistors has a resistance value. A squib circuit is determined based on the electrical signature of the squib circuit.

Figure 1:
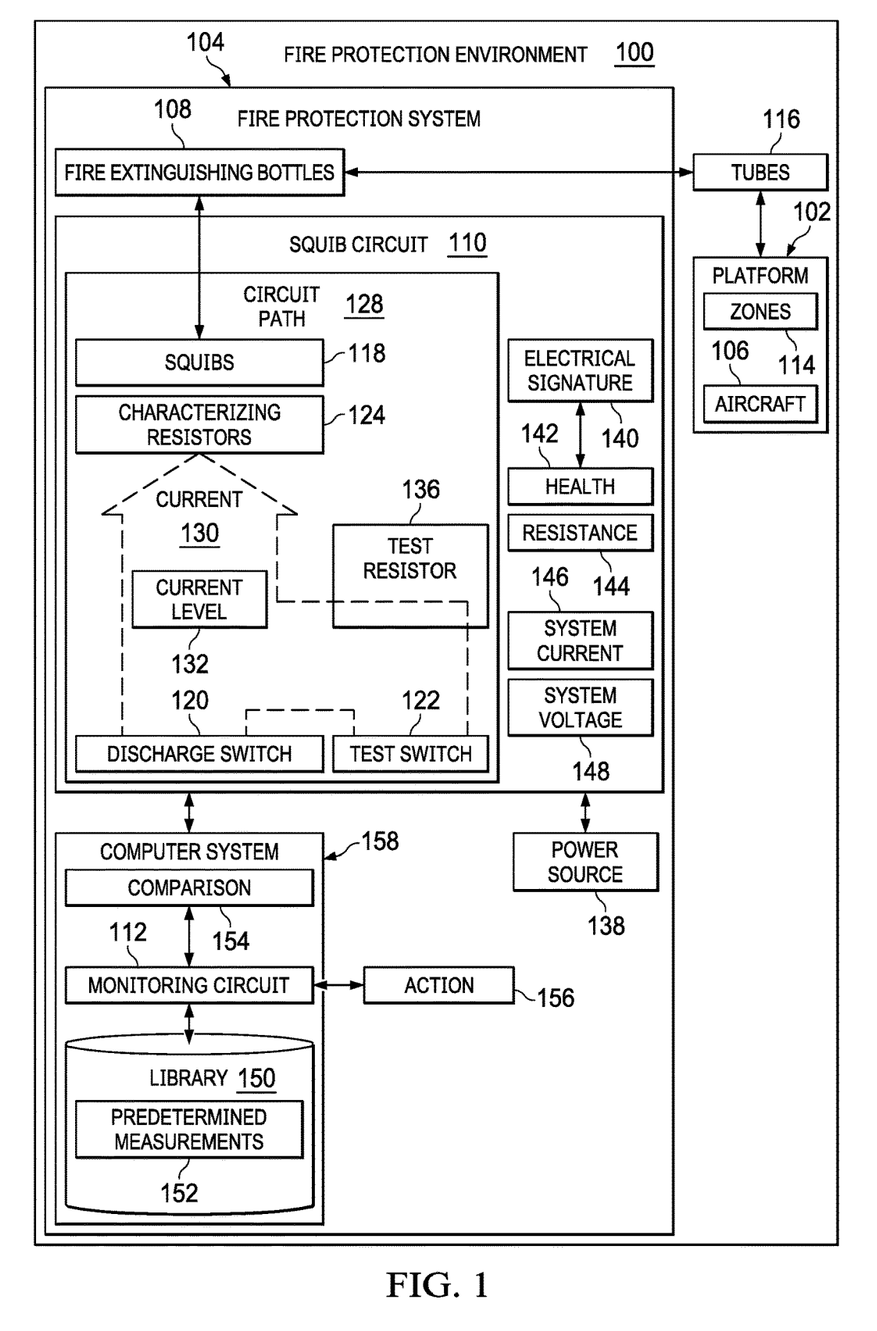
FIG. 1 is an illustration of a block diagram of a fire protection environment in accordance with an illustrative embodiment.

With reference now to the figures and, in particular, with reference to FIG. 1, an illustration of a block diagram of a fire protection environment is depicted in accordance with an illustrative embodiment. In this illustrative example, fire protection environment 100 comprises platform 102 in which fire protection system 104 is present. In this depicted example, platform 102 takes the form of aircraft 106.

As depicted, fire protection system 104 comprises a group of fire extinguishing bottles 108, squib circuit 110, and monitoring circuit 112. As used herein, "a group of," when used with reference to items, means one or more items. For example, "a group of fire extinguishing bottles" is one or more fire extinguishing bottles.

The group of fire extinguishing bottles 108 can be implemented using bottles that are pressurized with a fire protection material. For example, a fire extinguishing bottle can contain Halon 1211, which is Bromochlorodifluoromethane ($CBrClF_2$) or Halon 1301, which is Bromotrifluoromethane ($CBrF_3$). The fire extinguishing bottle may also include nitrogen. The group of fire extinguishing bottles 108 can be used to protect zones 114 in platform 102. For example, tubes 116 can be used to connect the group of fire extinguishing bottles 108 to zones 114. Tubes 116 direct the contents in the group of fire extinguishing bottles 108 to zones 114 when the group of fire extinguishing bottles 108 are discharged.

As depicted, squib circuit 110 is part of fire protection system 104 in aircraft 106 in one illustrative example. Squib circuit 110 is configured to cause the discharge of the group of fire extinguishing bottles 108. In this illustrative example, squib circuit 110 comprises squibs 118, discharge switch 120, test switch 122, characterizing resistors 124, and monitoring circuit 112.

In this illustrative example, squibs 118 are connected to the group of fire extinguishing bottles 108. A squib is an electronically operated explosive device.

Squibs 118 are connected to the group of fire extinguishing bottles 108 in a manner that allows a squib in squibs 118 to cause a fire extinguishing bottle in the group of fire extinguishing bottles 108 to discharge when the squib is detonated.

Squibs 118 are in circuit path 128. Circuit path 128 is one or more wires, traces, or other electrically conductive materials that electrically connect circuit components to each other. Circuit path 128 is configured such that squibs 118 can all detonate at substantially the same time. As depicted, discharge switch 120 is configured to send current 130 at current level 132 that causes squibs 118 in circuit path 128 to fire when discharge switch 120 is activated.

Test switch 122 is electrically connected to squibs 118 in circuit path 128. In this illustrative example, "electrically connected" means that test switch 122 can send current 130 to squibs 118 on circuit path 128. When test switch 122 is activated, test switch 122 is configured to cause current 130 flowing through squib circuit 110 to have current level 132 that avoids causing squibs 118 to detonate.

In the illustrative example, current 130 may be controlled to have current 130 flowing at current level 132 that does not cause squibs 118 to discharge when current 130 flows through test switch 122 by using test resistor 136. Test resistor 136 is series with test switch 122. Test resistor 136 has a resistance value selected to cause current 130 flowing through squib circuit 110 to have current level 132 that avoids causing squibs 118 to detonate.

In this illustrative example, test switch 122 is electrically connected to a same power source, power source 138, as discharge switch 120. Power source 138 may be an aircraft battery, a power bus, or some other suitable source of power.

As depicted, characterizing resistors 124 are electrically connected to test switch 122 in squib circuit 110. In other words, characterizing resistors 124 may not be electrically connected directly to test switch 122. Other components may be present between test switch 122 and characterizing resistors 124.

Characterizing resistors 124 are electrically connected to squibs 118. Each characterizing resistor in characterizing resistors 124 has a resistance value.

In some examples, the resistance value in each characterizing resistor in characterizing resistors 124 is a unique resistance value. In other words, each characterizing resistor can have a different resistance value from other ones of characterizing resistors 124.

In one illustrative example, characterizing resistors 124 are in series with squibs 118, and squibs 118 and characterizing resistors 124 are in parallel. In another illustrative example, squibs 118 are in series with each other, and squibs 118 are in parallel with associated characterizing resistors 124. This configuration is such that characterizing resistors 124 function as bypass resistors providing alternate paths through squib circuit 110.

Squib circuit 110 has electrical signature 140 based on characterizing resistors 124. In this illustrative example, electrical signature 140 can be used to indicate health 142 of squib circuit 110. For example, electrical signature 140 can indicate health 142 for each squib in squib circuit 110.

In this illustrative example, monitoring circuit 112 is electrically connected to squib circuit 110. Monitoring circuit 112 is configured to monitor electrical signature 140 of squib circuit 110 when test switch 122 is activated. In monitoring squib circuit 110, monitoring circuit 112 can monitor health 142 of each squib in squib circuit 110 using electrical signature 140 detected for the squib circuit 110.

In monitoring electrical signature 140 of squib circuit 110, monitoring circuit 112 is configured to measure resistance 144 for squib circuit 110. Resistance 144 is the total system resistance for squib circuit 110. As depicted, monitoring circuit 112 measures resistance 144 for squib circuit 110 using at least one of system current 146 or system voltage 148 for squib circuit 110.

As used herein, the phrase "at least one of", when used with a list of items, means different combinations of one or more of the listed items may be used, and only one of each item in the list may be needed. In other words, "at least one of" means any combination of items and number of items may be used from the list, but not all of the items in the list are required. The item may be a particular object, a thing, or a category.

For example, without limitation, "at least one of item A, item B, or item C" may include item A, item A and item B, or item B. This example also may include item A, item B, and item C or item B and item C. Of course, any combinations of these items may be present. In some illustrative examples, "at least one of" may be, for example, without limitation, two of item A; one of item B; and ten of item C; four of item B and seven of item C; or other suitable combinations.

In this illustrative example, monitoring circuit 112 is configured to compare resistance 144 measured for squib circuit 110 to library 150 of predetermined measurements 152 for squib circuit 110 to form comparison 154. Further, monitoring circuit 112 is configured to determine health 142 of each squib in squib circuit 110 based on comparison 154.

Monitoring circuit 112 is configured to perform action 156 based on health 142 determined for each squib in squib circuit 110. Action 156 is selected from a group comprised of generating an alert, logging the health, and displaying the health on an engine indications and crew alerting system, and other suitable actions.

Monitoring circuit 112 may be implemented in software, hardware, firmware or a combination thereof. When software is used, the operations performed by monitoring circuit 112 may be implemented in program code configured to run on hardware, such as a processor unit. When firmware is used, the operations performed by monitoring circuit 112 may be implemented in program code and data and stored in persistent memory to run on a processor unit. When hardware is employed, the hardware may include circuits that operate to perform the operations in monitoring circuit 112.

In the illustrative examples, the hardware may take a form selected from at least one of a circuit system, an integrated circuit, an application specific integrated circuit (ASIC), a programmable logic device, or some other suitable type of hardware configured to perform a number of operations. With a programmable logic device, the device may be configured to perform the number of operations. The device may be reconfigured at a later time or may be permanently configured to perform the number of operations. Programmable logic devices include, for example, a programmable logic array, a programmable array logic, a field programmable logic array, a field programmable gate array, and other suitable hardware devices. Additionally, the processes may be implemented in organic components integrated with inorganic components and may be comprised entirely of organic components excluding a human being. For example, the processes may be implemented as circuits in organic semiconductors.

Monitoring circuit 112 can be implemented in computer system 158, which is a physical hardware system and includes one or more data processing systems. When more than one data processing system is present, those data processing systems are in communication with each other using a communications medium. The communications medium may be a network. The data processing systems may be selected from at least one of a computer, a server computer, a tablet, or some other suitable data processing system.

In one illustrative example, one or more technical solutions are present that overcome a technical problem with reducing the weight of the squib circuit while maintaining a desired level of operation for a squib circuit. As a result, at least one of expense, complexity, or weight of the squib circuit may be reduced. In the illustrative example, one or more technical solutions are present in which characterizing resistors are used to provide an electrical signature for the squib circuit in which the electrical signature can be used to determine how squibs in the squib circuit are functioning. In other words, the electrical signature can be used to determine if squibs are operational.

The use of characterizing resistors in the squib circuit in the illustrative example may provide a technical effect in which the condition of the squib circuit, as well as the condition of each squib in the squib circuit, may be identified from the electrical signature of the squib circuit during testing. In other words, the use of characterizing resistors results in different electrical signatures being present depending on the condition of different squibs in the squib circuit.

The illustration of fire protection environment 100 in FIG. 1 is not meant to imply physical or architectural limitations to the manner in which an illustrative embodiment may be implemented. Other components in addition to or in place of the ones illustrated may be used. Some components may be unnecessary. Also, the blocks are presented to illustrate some functional components. One or more of these blocks may be combined, divided, or combined and divided into different blocks when implemented in an illustrative embodiment.

For example, although platform 102 is described with respect to aircraft 106 in the illustrative examples, other illustrative examples may be applied to other types of platforms. Platform 102 may be, for example, a mobile platform, a stationary platform, a land-based structure, an aquatic-based structure, and a space-based structure. More specifically, the platform may be a surface ship, a tank, a personnel carrier, a train, a spacecraft, a space station, a satellite, a submarine, an automobile, a power plant, a bridge, a dam, a house, a manufacturing facility, a building, and other suitable platforms.

Monitoring circuit 112 has been described as a circuit electrically connected to squib circuit 110 in the illustrative example. In another illustrative example, monitoring circuit 112 may be considered to be a part of squib circuit 110 rather than a separate circuit that is electrically connected to squib circuit 110.

As another example, fire protection system 104 may include other components, such as a sensor system, that is configured to detect the presence of a fire on platform 102. Sensor system can include smoke detectors, heat detectors, and other suitable types of sensors.

Further, one or more squib circuits in addition to squib circuit 110 may be present in fire protection system 104. The additional squib circuits may be connected to fire extinguishing bottles 108 or another set of fire extinguishing bottles in platform 102.

In yet another illustrative example, squib circuit 110 may be used in other environments other than fire protection environment 100. For example, squib circuit 110 may be used in airbag deployment systems in automobiles. Squib circuit 110 can be modified to activate pyrotechnic devices or other types of devices that cause gas generation for air bags.

Figure 2:
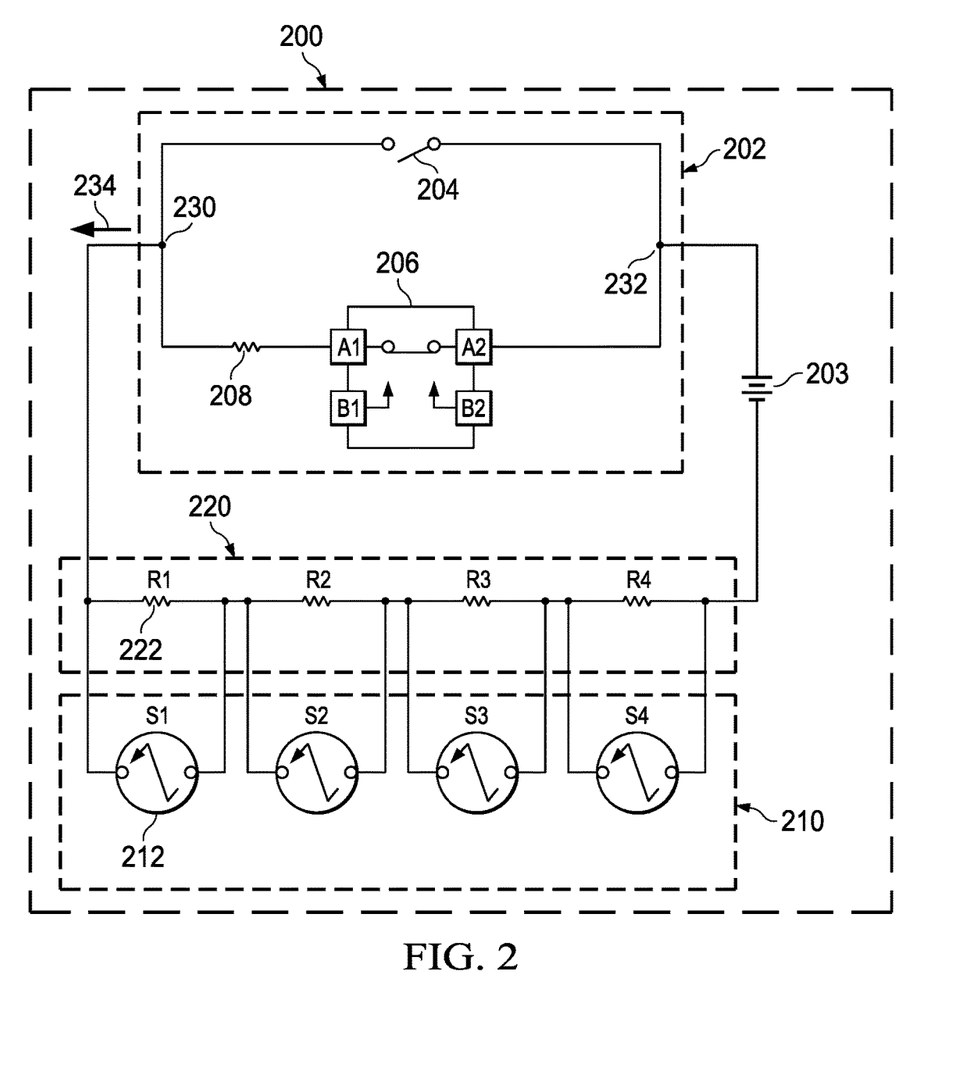
FIG. 2 is an illustration of a squib circuit in accordance with an illustrative embodiment.

With reference next to FIG. 2, an illustration of a squib circuit is depicted in accordance with an illustrative embodiment. In this illustrative example, squib circuit 200 is an example of one implementation for squib circuit 110 shown in block form in FIG. 1. Squib circuit 200 is an example of a series circuit system implementation.

As depicted, squib circuit 200 includes switching system 202. Switching system 202 is electrically connected to airplane battery 203. Switching system 202 comprises discharge switch 204 and test switch 206. Switching system 202 also includes test resistor 208 electrically connected in series with test switch 206.

As depicted, both discharge switch 204 and test switch 206 are connected to the same power source, airplane battery 203. Further, both of these switches use the same wiring.

The addition of test resistor 208 limits voltage and current in a manner that does not cause squibs 210 in squib circuit 200 to be activated and cause a discharge. In this illustrative example, squibs 210 includes squib S1, squib S2, squib S3, and squib S4. Squib circuit 200 also includes characterizing resistors 220 as follows: characterizing resistor R1, characterizing resistor R2, characterizing resistor R3, and characterizing resistor R4.

In this illustrative example, squib S1, squib S2, squib S3, and squib S4 are connected in series. Characterizing resistor R1 is electrically connected in parallel to squib S1; characterizing resistor R2 is electrically connected in parallel to squib S2; characterizing resistor R3 is electrically connected in parallel to squib S3; and characterizing resistor R4 is electrically connected in parallel to squib S4. Squib S4 and characterizing resistor R4 are electrically connected to airplane battery 203.

Characterizing resistors 220 form bypass branches to squibs 210. The resistance values for characterizing resistors 220 are selected such that most of the current flows through squibs 210 rather than characterizing resistors 220. Increased current flow through a characterizing resistor occurs if a squib has failed. For example, more current loads characterizing resistor 222 if squib 212 fails.

Further, each of characterizing resistors 220 have unique resistance as compared to others of characterizing resistors 220. As a result of this type of selection of resistance, a combination of different failures within squibs 210 results in different electrical characteristics for squib circuit 200. In this manner, measuring the resistance of squib circuit 200 through detecting at least one of a system voltage or a system current can be used to determine the health of squib circuit 200. In this illustrative example, the system voltage can be detected as the voltage across node 230 and node 232. The system current may be current 234 in this illustrative example.

Figure 3:
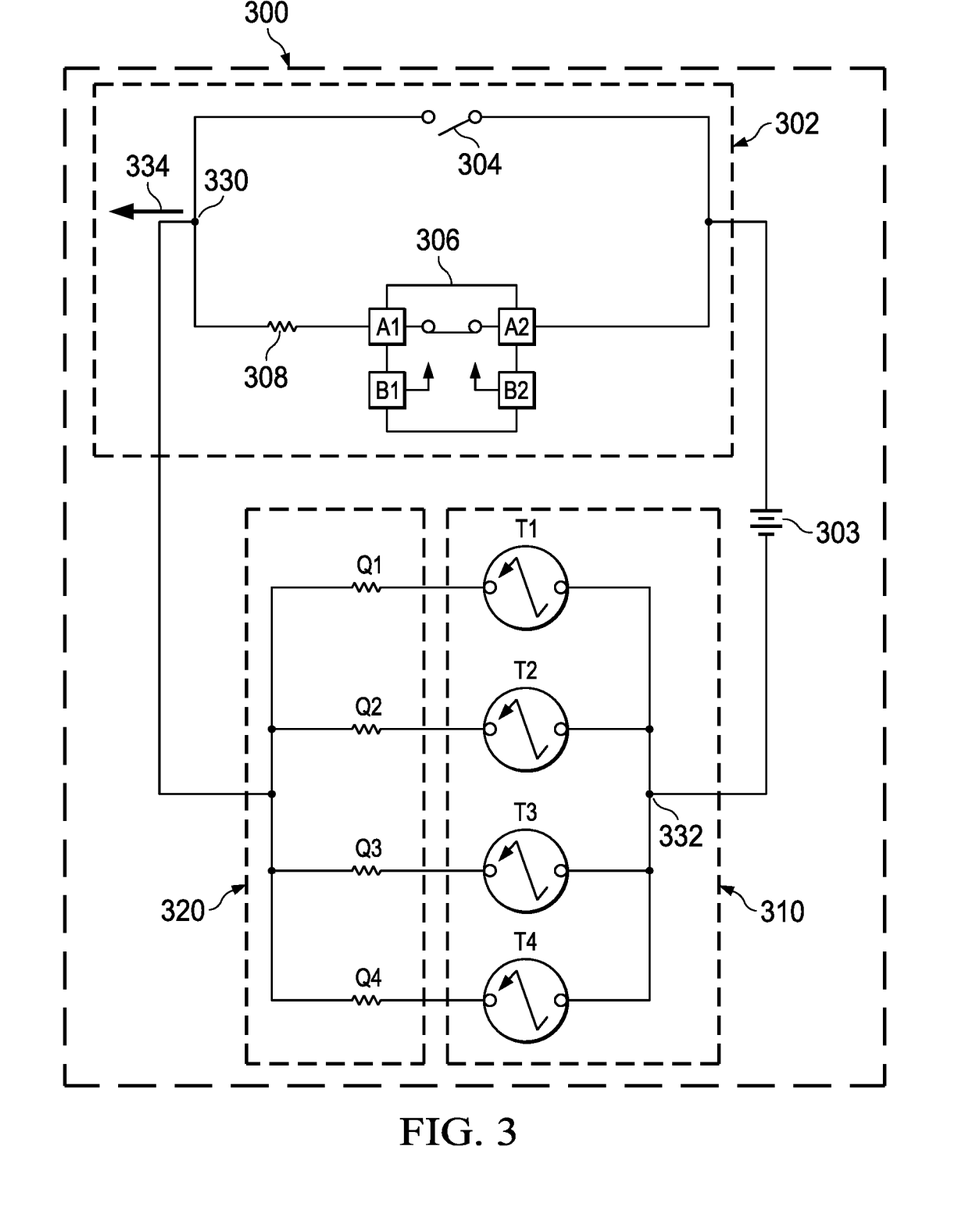
FIG. 3 is an illustration of a squib circuit in accordance with an illustrative embodiment.

With reference next to FIG. 3, an illustration of a squib circuit is depicted in accordance with an illustrative embodiment. Squib circuit 300 is an example of another implementation for squib circuit 110 shown in block form in FIG. 1. Squib circuit 300 is an example of a parallel circuit system implementation.

As depicted, squib circuit 300 includes switching system 302. Switching system 302 is electrically connected to airplane battery 303. Switching system 302 comprises discharge switch 304 and test switch 306. As depicted, both discharge switch 304 and test switch 306 are electrically connected to the same power source, airplane battery 303. Both of these switches use the same wiring.

Test resistor 308 in switching system 302 is in series with test switch 306. The use of test resistor 308 with test switch 306 limits voltage and current in a manner that does not cause squibs 310 to be activated and cause a discharge.

As depicted, squibs 310 include squib T1, squib T2, squib T3, and squib T4. Squib circuit 300 also includes characterizing resistors 320, which include characterizing resistor Q1, characterizing resistor Q2, characterizing resistor Q3, and characterizing resistor Q4.

In this illustrative example, squib T1, squib T2, squib T3, and squib T4 are electrically connected in parallel to each other. Characterizing resistor Q1 is electrically connected in series to squib T1; characterizing resistor Q2 is electrically connected in series to squib T2; characterizing resistor Q3 is electrically connected in series to squib T3; and characterizing resistor Q4 is electrically connected in series to squib T4.

Squib T1, squib T2, squib T3, squib T4, characterizing resistor Q1, characterizing resistor Q2, characterizing resistor Q3, and characterizing resistor Q4 are electrically connected to airplane battery 303.

In the illustrative example, each of characterizing resistors 320 has unique resistance as compared to others of characterizing resistors 320. As a result, a combination of different failures within squibs 310 results in different electrical characteristics for squib circuit 300. For example, if squib T2 fails, current does not travel through characterizing resistor Q2 and squib T2. As a result, the resistance for squib circuit 300 is different from when squib T2 is operating properly, resulting in a different electrical signature.

In this manner, measuring the resistance of squib circuit 300 through detecting at least one of a system voltage or a system current may be used to determine the health of squib circuit 300. In this illustrative example, the system voltage may be detected as the voltage across node 330 and node 332. The system current may be current 334 in this illustrative example.

The illustrations of squib circuit 200 in FIG. 2 and squib circuit 300 in FIG. 3 are presented for purposes of illustrating some examples of how squib circuit 110, shown in block form in FIG. 1, may be implemented. These illustrations are not meant to limit the manner in which other squib circuits may be implemented in accordance with an illustrative embodiment. For example, other squib circuits may include additional characterizing resistors or fewer characterizing resistors as compared to the number of characterizing resistors shown in these examples.

Figure 4:
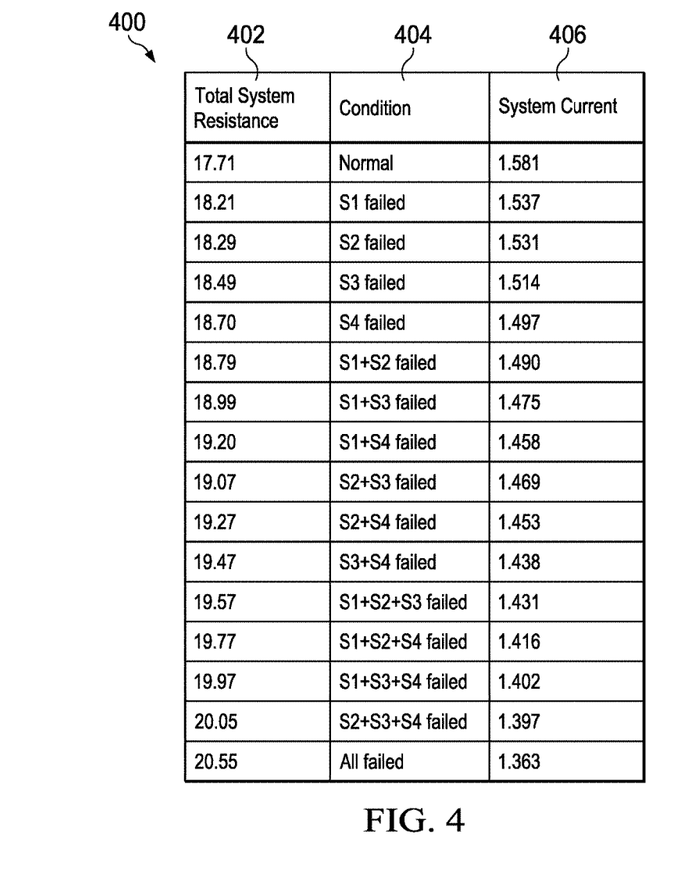
FIG. 4 is an illustration of a table of electrical characteristics for a squib circuit with a series configuration in accordance with an illustrative embodiment.

With reference next to FIG. 4, an illustration of a table of electrical characteristics for a squib circuit with a series configuration is depicted in accordance with an illustrative embodiment. In this illustrative example, table 400 illustrates electrical characteristics that form an electrical signature for squib circuit 200 in FIG. 2. This illustrative example is based on a circuit with a power source providing 28 volts of direct current. System characteristics would change with a different power source, and would be selected based on the application.

In this illustrative example, resistance values of the characterizing resistors are as follows: characterizing resistor R1=1 ohm, characterizing resistor R2=1.1 ohms, characterizing resistor R3=1.35 ohms, and characterizing resistor R4=1.6 ohms. The resistance values for characterizing resistors 220 of FIG. 2 have been selected as unique resistance values. As a result, each branch containing a characterizing resistor and squib has a specific electrical signature that is different from another branch containing a different characterizing resistor and squib.

As depicted in table 400, total system resistance column 402 is the total system resistance for squib circuit 200. The resistance values in total system resistance column 402 are predetermined resistances based on the design of squib circuit 200 that correspond to known conditions for different components in squib circuit 200. Condition column 404 identifies conditions for the predetermined resistance values of total system resistance in total system resistance column 402.

In this illustrative example, the total system resistance may be measured by measuring at least one of system voltage or system current. The total system resistance is an example of resistance 144 shown in block form in FIG. 1.

The measured total system resistance may be compared to resistance values in total system resistance column 402 to identify a condition in condition column 404 for squib circuit 200. As depicted, examples of values of current levels in squib circuit 200 may be used to identify a condition in condition column 404.

As can be seen, the electrical signature can be identified through measuring the total system resistance, which may be identified by measuring the system current and comparing the measured values for the system current to the values in system current column 406.

Figure 5:
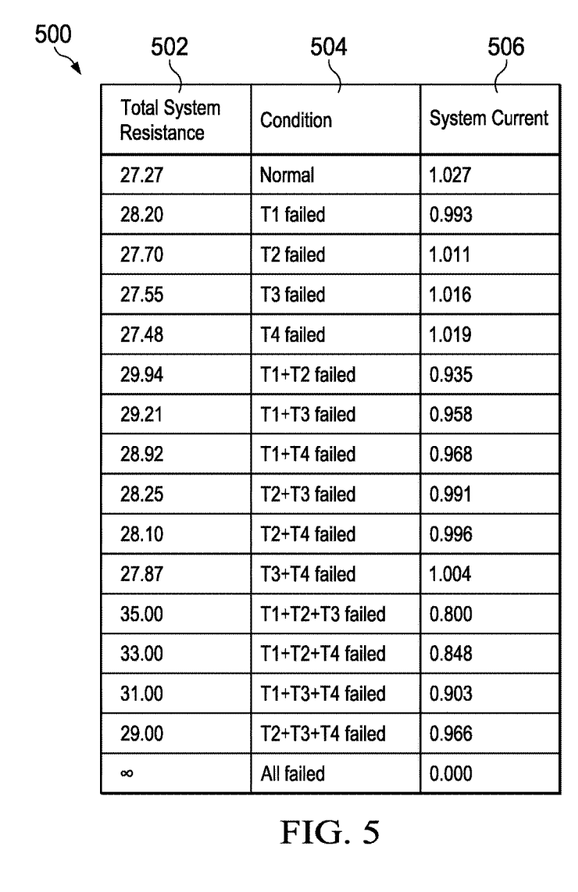
FIG. 5 is an illustration of a table of electrical characteristics for a squib circuit with a parallel configuration in accordance with an illustrative embodiment.

With reference next to FIG. 5, an illustration of a table of electrical characteristics for a squib circuit with a parallel configuration is depicted in accordance with an illustrative embodiment. In this illustrative example, table 500 illustrates electrical characteristics that form an electrical signature for squib circuit 300 in FIG. 3. This illustrative example is based on a circuit with a power source providing 28 volts of direct current. System characteristics would change with a different power source, and would be selected based on the application.

In this illustrative example, resistance values of the characterizing resistors are as follows: characterizing resistor Q1=2 ohms, characterizing resistor Q2=4 ohms, characterizing resistor Q3=6 ohms, and characterizing resistor Q4=8 ohms. The resistance values for characterizing resistors 320 have been selected as unique resistance values. As a result, each branch containing a characterizing resistor and squib has a specific electrical signature.

As depicted in table 500, total system resistance column 502 is the total system resistance for squib circuit 300. These resistance values in total system resistance column 502 are predetermined resistances based on the design of squib circuit 300 that correspond to known conditions for different components in squib circuit 300. In this illustrative example, condition column 504 identifies conditions for the predetermined resistance values of total system resistance in total system resistance column 502.

As depicted, the total system resistance of squib circuit 300 during testing of squib circuit 300 may be measured by measuring at least one of system voltage or system current. The total system resistance is an example of resistance 144 shown in block form in FIG. 1.

The measured total system resistance may be compared to resistance values in total system resistance column 502 to identify a condition in condition column 504 for squib circuit 300. As depicted, examples of values of current levels in squib circuit 300 may be used to identify a condition in condition column 504.

Thus, the electrical signature can be identified through measuring the total system resistance, which may be identified by measuring the system current and comparing the measured values for the system current to the values in system current column 506.

The illustrations of table 400 in FIG. 4 and table 500 in FIG. 5 are shown as an illustration of one manner in which an electrical signature in a squib circuit may be used to determine which squibs are functioning as desired. The illustrations of the tables in FIG. 4 and FIG. 5 are not meant to limit the manner in which other illustrative examples may be implemented. For example, in other illustrative examples, other values may be used for the characterizing resistors. Other illustrative examples may specify specific system voltages that may be measured to identify the condition of a squib circuit.

Figure 6:
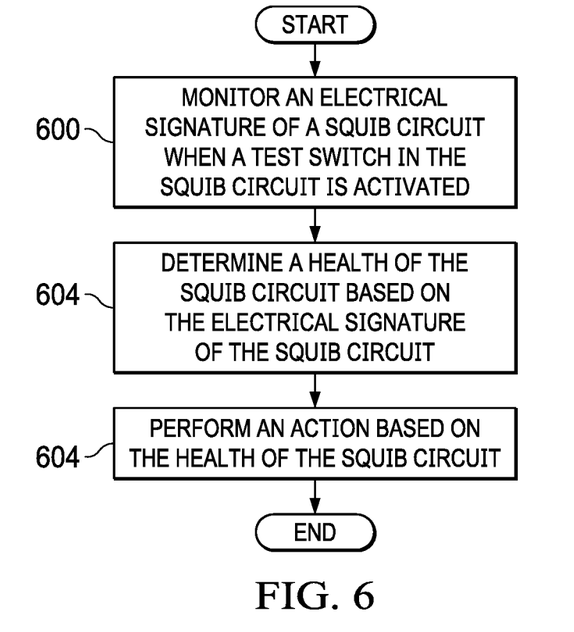
FIG. 6 is an illustration of a flowchart of a process for testing a squib circuit in accordance with an illustrative embodiment.

Turning next to FIG. 6, an illustration of a flowchart of a process for testing a squib circuit is depicted in accordance with an illustrative embodiment. The process illustrated in FIG. 6 may be implemented in squib circuit 110 in fire protection environment 100, both shown in block form in FIG. 1.

The process begins by monitoring an electrical signature of a squib circuit when a test switch in the squib circuit is activated (operation 600). The electrical signature of the squib circuit is based on characterizing resistors electrically connected to squibs in the squib circuit in which each characterizing resistor in the characterizing resistors has a resistance value.

The process determines a health of the squib circuit based on the electrical signature of the squib circuit (operation 602). When the resistance values are unique values, the health of each squib in the squib circuit can be determined.

The process then performs an action based on the health of the squib circuit (operation 604). The process terminates thereafter.

The action may take a number of different forms. For example, based on the health determined for the squib circuit, an action can be taken. For example, the status of the squib circuit can be displayed in a display system in an engine indicating and crew alerting system (EICAS). For example, the status of particular squibs may be displayed based on the identification of the condition of the squibs using a table such as table 400 in FIG. 4 or table 500 FIG. 5.

Indications can include a general indication of the health of the squib circuit. If a problem is present, additional information can be displayed. For example, the additional information may be an identification of a group of squibs that are faulty.

With the identification of the group of squibs that have failed, maintenance of the squib circuit may be performed more efficiently. For example, manual testing of each squib in the squib circuit becomes unnecessary using an illustrative example. Instead, maintenance may be performed through replacing faulty squibs without requiring testing of each squib in the squib circuit by a maintenance person.

The action may take yet other forms other than displaying information on an engine indicating and crew alerting system. For example, a message may be sent, an alert may be generated, an entry may be made in a log, the status may be displayed, or some other suitable action or combination of actions may be taken.

Figure 7:
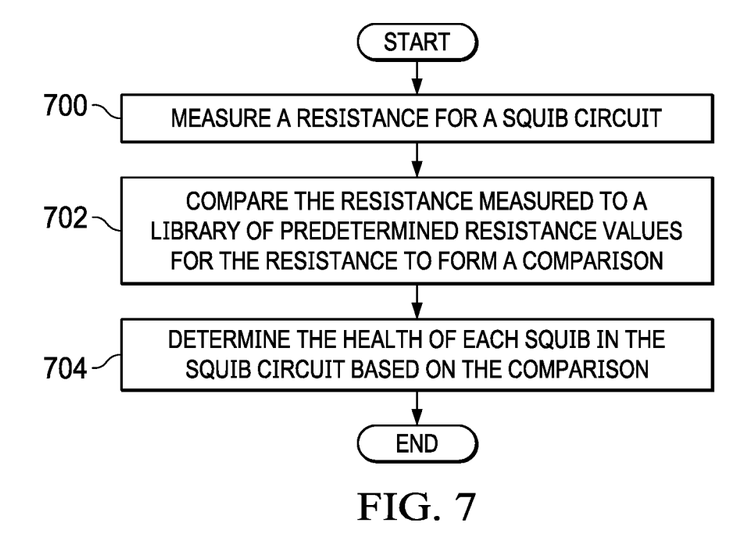
FIG. 7 is an illustration of a flowchart of a process for monitoring an electrical signal of a squib circuit in accordance with an illustrative embodiment.

With reference next to FIG. 7, an illustration of a flowchart of a process for monitoring an electrical signal of a squib circuit is depicted in accordance with an illustrative embodiment. The process illustrated in FIG. 7 is an example of one implementation for operation 600 in FIG. 6.

The process begins by measuring a resistance for a squib circuit (operation 700). The process compares the resistance measured to a library of predetermined resistance values for the resistance to form a comparison (operation 702). The library of predetermined items may take a number of different forms. For example, the library may be a table such as table 400 in FIG. 4 or table 500 in FIG. 5.

The process determines the health of each squib in the squib circuit based on the comparison (operation 704). The process terminates thereafter.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent at least one of a module, a segment, a function, or a portion of an operation or step. For example, one or more of the blocks may be implemented as program code, hardware, or a combination of the program code and hardware. When implemented in hardware, the hardware may, for example, take the form of integrated circuits that are manufactured or configured to perform one or more operations in the flowcharts or block diagrams. When implemented as a combination of program code and hardware, the implementation may take the form of firmware. Each block in the flowcharts or the block diagrams may be implemented using special purpose hardware systems that perform the different operations or combinations of special purpose hardware and program code run by the special purpose hardware.

In some alternative implementations of an illustrative embodiment, the function or functions noted in the blocks may occur out of the order noted in the figures. For example, in some cases, two blocks shown in succession may be performed substantially concurrently, or the blocks may sometimes be performed in the reverse order, depending upon the functionality involved. Also, other blocks may be added in addition to the illustrated blocks in a flowchart or block diagram.

Figure 8:
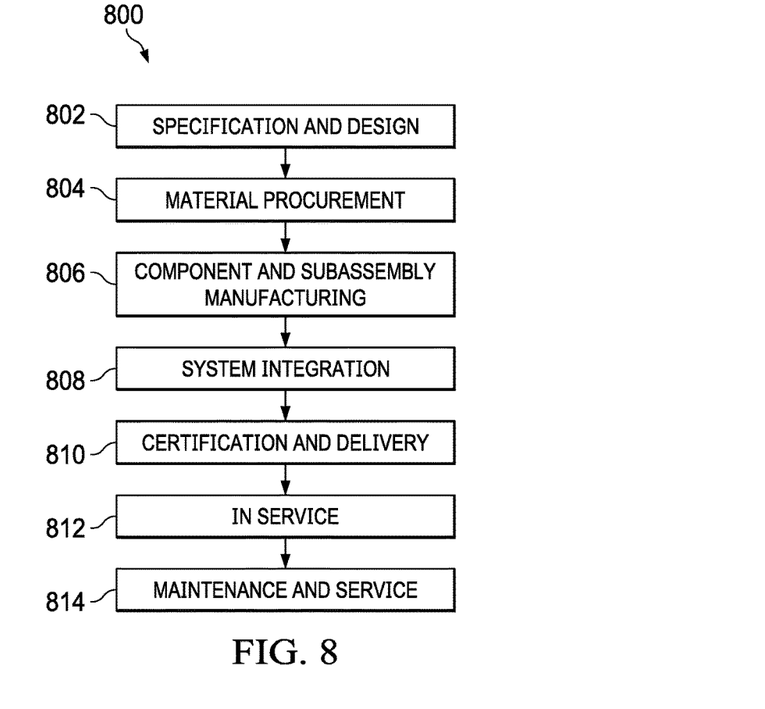
FIG. 8 is an illustration of a block diagram of an aircraft manufacturing and service method in accordance with an illustrative embodiment.
Figure 9:
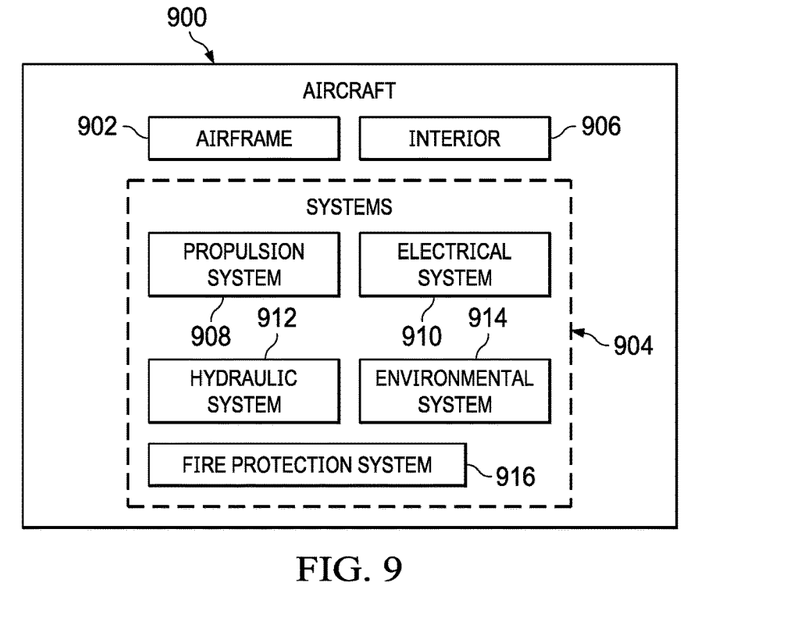
FIG. 9 is an illustration of a block diagram of an aircraft in accordance with an illustrative embodiment.

The illustrative embodiments of the present disclosure may be described in the context of aircraft manufacturing and service method 800 as shown in FIG. 8 and aircraft 900 as shown in FIG. 9. Turning first to FIG. 8, an illustration of a block diagram of an aircraft manufacturing and service method is depicted in accordance with an illustrative embodiment. During pre-production, aircraft manufacturing and service method 800 may include specification and design 802 of aircraft 900 in FIG. 9 and material procurement 804.

During production, component and subassembly manufacturing 806 and system integration 808 of aircraft 900 takes place. Thereafter, aircraft 900 may go through certification and delivery 810 in order to be placed in service 812. While in service 812 by a customer, aircraft 900 is scheduled for routine maintenance and service 814, which may include modification, reconfiguration, refurbishment, and other maintenance or service.

Each of the processes of aircraft manufacturing and service method 800 may be performed or carried out by a system integrator, a third party, an operator, or some combination thereof. In these examples, the operator may be a customer. For the purposes of this description, a system integrator may include, without limitation, any number of aircraft manufacturers and major-system subcontractors; a third party may include, without limitation, any number of vendors, subcontractors, and suppliers; and an operator may be an airline, a leasing company, a military entity, a service organization, and so on.

With reference now to FIG. 9, an illustration of a block diagram of an aircraft is depicted in which an illustrative embodiment may be implemented. In this example, aircraft 900 is produced by aircraft manufacturing and service method 800 in FIG. 8 and may include airframe 902 with plurality of systems 904 and interior 906. Examples of systems 904 include one or more of propulsion system 908, electrical system 910, hydraulic system 912, environmental system 914, and fire protection system 916. Any number of other systems may be included.

In the illustrative example, fire protection system 916 may be implemented using fire protection system 104 shown in block form in FIG. 1. Although an aerospace example is shown, different illustrative embodiments may be applied to other industries, such as the automotive industry.

Apparatuses and methods embodied herein may be employed during at least one of the stages of aircraft manufacturing and service method 800 in FIG. 8.

In one illustrative example, components or subassemblies produced in component and subassembly manufacturing 806 in FIG. 8 may be fabricated or manufactured in a manner similar to components or subassemblies produced while aircraft 900 is in service 812 in FIG. 8. As yet another example, one or more apparatus embodiments, method embodiments, or a combination thereof may be utilized during production stages, such as component and subassembly manufacturing 806 and system integration 808 in FIG. 8. For example, fire protection system 104 shown in block form in FIG. 1 may be assembled and integrated into aircraft 900 during system integration 808. Fire protection system 104 may be utilized and tested during certification and delivery 810.

One or more apparatus embodiments, method embodiments, or a combination thereof may be utilized while aircraft 900 is in service 812, during maintenance and service 814 in FIG. 8, or both. Fire protection system 104 may be utilized during in service 812. Fire protection system 104 also may be added to aircraft 900 during maintenance and service 814, may include modification, reconfiguration, refurbishment, and other maintenance or service. Further, fire protection system 104 may be tested during maintenance and service 814 utilizing squib circuit 110.

The use of a number of the different illustrative embodiments may substantially expedite the assembly of aircraft 900, reduce the cost of aircraft 900, or both expedite the assembly of aircraft 900 and reduce the cost of aircraft 900. For example, when implementing a fire protection system in accordance with an illustrative embodiment, the amount of wires needed for a squib circuit may be reduced. In this manner, at least one of cost, complexity, or weight of aircraft 900 may be reduced.

Thus, the different illustrative examples provide an ability to monitor the condition of a squib circuit through the use of characterizing resistors that results in an electrical signature that changes based on the condition of the squib circuit. For example, the use of characterizing resistors results in different electrical signatures being present depending on the condition of different squibs in the squib circuit. In this manner, a single circuit with an initiating switch and a test switch may be used to both monitor and activate squibs in a fire protection system without using at least one of large numbers of additional poles, additional wiring, or other undesired components or circuit designs.

The description of the different illustrative embodiments has been presented for purposes of illustration and description and are not intended to be exhaustive or limited to the embodiments in the form disclosed. The different illustrative examples describe components that perform actions or operations. In an illustrative embodiment, a component may be configured to perform the action or operation described. For example, the component may have a configuration or design for a structure that provides the component an ability to perform the action or operation that is described in the illustrative examples as being performed by the component.

Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. An apparatus that comprises:
a test switch wired in series with a test resistor in a circuit path electrically connected to squibs and a power source in a squib circuit, the test switch and the test resistor wired in series with each other being wired in parallel with a discharge switch for the squibs and configured to:
activate or prevent a test current to the squibs; and
test a health of the squib circuit; and
characterizing resistors electrically connected to the test switch in the squib circuit and to the squibs such that each characterizing resistor in the characterizing resistors comprises, respectively, a resistance value unique from each other characterizing resistor in the characterizing resistors; and
an electrical signature of the squib circuit based on the characterizing resistors indicates the health of the squib circuit.

2. The apparatus of claim 1, wherein the resistance value in each characterizing resistor in the characterizing resistors is a unique resistance value and wherein the electrical signature indicates a health of each squib in the squibs.

3. The apparatus of claim 2 further comprising:
a monitoring circuit electrically connected to the squib circuit, wherein the monitoring circuit is configured to monitor the electrical signature of the squib circuit responsive to activation of the test switch.

4. The apparatus of claim 3, wherein the resistance value in each characterizing resistor in the characterizing resistors is a unique resistance value and wherein the monitoring circuit is configured to determine the health of each squib in the squib circuit using the electrical signature detected for the squib circuit.

5. The apparatus of claim 4, wherein the monitoring circuit is configured to perform an action based on the health determined for each squib in the squib circuit.

6. The apparatus of claim 5, wherein the action is selected from a group comprising generating an alert, logging the health, and displaying the health on an engine indications and crew alerting system.

7. The apparatus of claim 3, wherein in monitoring the electrical signature of the squib circuit, the monitoring circuit is configured to measure a resistance for the squib circuit.

8. The apparatus of claim 7, wherein the monitoring circuit is configured to compare the resistance measured for the squib circuit to a library of predetermined measurements for the squib circuit to form a comparison; and determine the health of each squib in the squib circuit based on the comparison.

9. The apparatus of claim 7, wherein the monitoring circuit measures the resistance for the squib circuit using at least one of a system current or a system voltage for the squib circuit.

10. The apparatus of claim 1, wherein the characterizing resistors are in series with the squibs, and wherein the squibs and the characterizing resistors are in parallel.

11. The apparatus of claim 1, wherein the characterizing resistors are in series with each other and the squibs are in parallel with associated characterizing resistors, such that the characterizing resistors function as bypass resistors providing alternate paths through the squib circuit.

12. The apparatus of claim 1, wherein the test switch is electrically connected to a same power source as the discharge switch configured to cause the squibs in the squib circuit to fire responsive to activation of the discharge switch.

13. The apparatus of claim 1, wherein the test switch is configured to cause a current flowing through the squib circuit to have a current level that avoids causing the squibs to detonate.

14. The apparatus of claim 13 further comprising:
wherein the test resistor has a resistance value selected to cause the current flowing through the squib circuit to have the current level that avoids causing the squibs to detonate.

15. The apparatus of claim 1, wherein the squib circuit is part of a fire protection system in an aircraft.

16. A fire protection system that comprises:
a group of fire extinguishing bottles;
a squib circuit comprising:
squibs connected to the group of fire extinguishing bottles;
a discharge switch configured to cause the squibs in a circuit path to detonate responsive to activation of the discharge switch;
a test switch wired in series with a test resistor electrically connected to the squibs in the circuit path, the test switch and the test resistor wired in series with each other being wired in parallel with the discharge switch for the squibs and configured to:
activate or prevent a test current to the squibs; and
test a health of the squib circuit;

characterizing resistors electrically connected to the test switch in the squib circuit and to the squibs such that each characterizing resistor in the characterizing resistors comprises, respectively, a value unique from each other characterizing resistor in the characterizing resistors; and an electrical signature, based upon the characterizing resistors, of the squib circuit that indicates a health of each squib in the squib circuit; and a monitoring circuit electrically connected to the squib circuit and configured to monitor the electrical signature of the squib circuit responsive to activation of the test switch.

17. The fire protection system of claim 16, wherein the characterizing resistors are in series with the squibs.

18. The fire protection system of claim 16, wherein the characterizing resistors are in parallel with the squibs and function as bypass resistors providing alternate paths through the squib circuit.

19. A method for testing a squib circuit, the method comprising:

monitoring an electrical signature of the squib circuit responsive to activating a test switch in the squib circuit, the squib circuit comprising the test switch wired in series with a test resistor in a circuit path electrically connected to squibs and a power source in the squib circuit, the test switch and the test resistor wired:

in series with each other for activating or preventing a test current flowing to squibs in the squib circuit and testing a health of the squib circuit; and in parallel with a discharge switch;

basing the electrical signature of the squib circuit on characterizing resistors electrically connected to squibs in the squib circuit, each characterizing resistor in the characterizing resistors comprising, respectively, a resistance value unique from each other characterizing resistor in the characterizing resistors; and determining the health of the squib circuit based on the electrical signature of the squib circuit.

20. The method of claim 19, further comprising performing an action based on the health determined for the squib circuit.

21. The method of claim 20, wherein the action is selected from a group comprising generating an alert, logging the health, and displaying the health on an engine indications and crew alerting system.

22. The method of claim 19, wherein monitoring the electrical signature of the squib circuit comprises measuring a resistance for the squib circuit.

23. The method of claim 22, wherein the resistance value in each characterizing resistor in the characterizing resistors is a unique resistance value and wherein determining the health the squib circuit based on the electrical signature of the squib circuit comprises:

measuring the resistance for the squib circuit;

comparing the resistance to a library of predetermined resistance values for the resistance to form a comparison; and determining a health of each squib in the squib circuit based on the comparison.

24. The method of claim 19, wherein measuring a resistance for the squib circuit comprises measuring at least one of a system current or a system voltage for the squib circuit.

25. The method of claim 19, wherein the resistance value in each characterizing resistor in the characterizing resistors is a unique resistance value and wherein determining the health of the squib circuit based on the electrical signature of the squib circuit comprises:

detecting at least one of a system current or a system voltage in the squib circuit;

comparing the value of at least one of the system current or the system voltage to a library of predetermined values for the system current to form a comparison; and determining a health of each squib in the squib circuit based on the comparison.

26. The method of claim 19, wherein the characterizing resistors are in series with the squibs, and wherein the squibs and the characterizing resistors are in parallel.

27. The method of claim 19, wherein the characterizing resistors are in series with each other and the squibs are in parallel with associated characterizing resistors, such that the characterizing resistors function as bypass resistors providing alternate paths through the squib circuit.

28. The method of claim 19, further comprising:

causing a current flowing through the squib circuit to have a current level that avoids causing the squibs to detonate responsive to activating the test switch.

29. The method of claim 27, further comprising a test resistor in series with the test switch, wherein the test resistor has a resistance value selected to cause the current flowing through the squib circuit to have the current level that avoids causing the squibs to detonate.

30. The method of claim 19, wherein the test switch is electrically connected to a same power source as the discharge switch configured to cause the squibs in the squib circuit to detonate responsive to activating the discharge switch.

* * * * *